(12) United States Patent
Matsui et al.

(10) Patent No.: US 9,598,305 B2
(45) Date of Patent: Mar. 21, 2017

(54) SYNTHETIC QUARTZ GLASS SUBSTRATE AND MAKING METHOD

(75) Inventors: Harunobu Matsui, Joetsu (JP); Daijitsu Harada, Joetsu (JP); Masaki Takeuchi, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 527 days.

(21) Appl. No.: 13/113,152

(22) Filed: May 23, 2011

(65) Prior Publication Data

US 2011/0287219 A1   Nov. 24, 2011

(30) Foreign Application Priority Data

May 24, 2010   (JP) .................. 2010-118319

(51) Int. Cl.
| | | |
|---|---|---|
| *B32B 3/00* | (2006.01) | |
| *B24B 49/00* | (2012.01) | |
| *C03C 3/06* | (2006.01) | |
| *B82Y 10/00* | (2011.01) | |
| *B82Y 40/00* | (2011.01) | |
| *C03C 19/00* | (2006.01) | |
| *G03F 1/60* | (2012.01) | |
| *G03F 7/00* | (2006.01) | |
| *G03F 1/24* | (2012.01) | |

(52) U.S. Cl.
CPC .............. *C03C 3/06* (2013.01); *B82Y 10/00* (2013.01); *B82Y 40/00* (2013.01); *C03C 19/00* (2013.01); *G03F 1/60* (2013.01); *G03F 7/0002* (2013.01); *C03C 2201/42* (2013.01); *C03C 2204/08* (2013.01); *G03F 1/24* (2013.01); *Y10T 428/24355* (2015.01)

(58) Field of Classification Search
CPC ....... C03C 3/06; C03C 19/00; C03C 2201/42; C03C 2204/08; B82Y 10/00; B82Y 40/00; G03F 7/0002; G03F 1/60; G03F 1/24; Y10T 428/24355
USPC .............................................. 428/141; 430/5
See application file for complete search history.

(56) References Cited

U.S. PATENT DOCUMENTS

| | | |
|---|---|---|
| 7,579,120 B2 | 8/2009 | Akagawa |
| 2004/0192171 A1 | 9/2004 | Koike |
| 2004/0253524 A1 | 12/2004 | Itoh |
| 2005/0019677 A1 | 1/2005 | Nakatsu et al. |

(Continued)

FOREIGN PATENT DOCUMENTS

| | | |
|---|---|---|
| DE | 10 2004 014 953 A1 | 11/2004 |
| JP | 2004-291209 A | 10/2004 |

(Continued)

OTHER PUBLICATIONS

Extended European Search Report, dated Nov. 23, 2012, for European Application No. 11166989.1.

(Continued)

*Primary Examiner* — Laura Auer
(74) *Attorney, Agent, or Firm* — Birch, Stewart, Kolasch & Birch, LLP

(57) ABSTRACT

A synthetic quartz glass substrate has a surface of 6 inch squares including a central surface area of 132 mm squares. The central surface area of 132 mm squares has a flatness of up to 50 nm. A frame region obtained by subtracting the central surface area of 132 mm squares from the central surface area of 148 mm squares has a flatness of up to 150 nm.

12 Claims, 2 Drawing Sheets

(56) References Cited

U.S. PATENT DOCUMENTS

| | | |
|---|---|---|
| 2006/0068300 A1 | 3/2006 | Tanabe et al. |
| 2008/0032213 A1* | 2/2008 | Kikugawa et al. ............... 430/5 |
| 2009/0017257 A1 | 1/2009 | Otsuka et al. |
| 2009/0017387 A1* | 1/2009 | Shoki ................................ 430/5 |
| 2010/0075577 A1 | 3/2010 | Kojima et al. |
| 2010/0081067 A1 | 4/2010 | Tanabe |
| 2010/0104955 A1 | 4/2010 | Shiota |

FOREIGN PATENT DOCUMENTS

| | | |
|---|---|---|
| JP | 2004-361432 A | 12/2004 |
| JP | 2006-176341 A | 7/2006 |
| JP | 2007-287737 A | 11/2007 |
| WO | WO 2004/083961 A1 | 9/2004 |
| WO | WO 2007/119860 A1 | 10/2007 |

OTHER PUBLICATIONS

Jonckheere et al., "Assessment of EUV reticle blank availability enabling the use of EUV tools today and in the future," Proc. of SPIE, The International Society for Optical Engineering—SPIE, Bellingham, Washington, USA, vol. 6533, Jan. 22, 2007, XP-002441100, pp. 653313-1-653313-12.

The Office Action (including English translation), dated Apr. 2, 2014, issued in the corresponding Chinese Patent Application No. 201110218545.6.

* cited by examiner

SYNTHETIC QUARTZ GLASS SUBSTRATE AND MAKING METHOD

CROSS-REFERENCE TO RELATED APPLICATION

This non-provisional application claims priority under 35 U.S.C. §119(a) on Patent Application No. 2010-118319 filed in Japan on May 24, 2010, the entire contents of which are hereby incorporated by reference.

TECHNICAL FIELD

This invention relates to a synthetic quartz glass substrate suited for use as a photomask, and more particularly, to a synthetic quartz glass substrate whose surface has a high flatness, low defect density, and minimal surface roughness and which is suited for use in the advanced applications of EUV lithography and nano-imprint technology, and a method for preparing the same.

BACKGROUND ART

The lithography using radiation of very short wavelength such as soft x-ray makes fine image writing possible at the sacrifice of focal depth. For printing a fine precise pattern, the substrate for the reflective mask is required to meet the completeness of surface parameters including high flatness, low defect density, and minimal surface roughness.

It is contemplated to use a synthetic quartz glass substrate having a high flatness as the mask substrate for permitting the current lithography using ArF excimer laser (wavelength 193 nm) to survive until the transition to the extreme ultraviolet lithography (EUVL).

At the present, substrates are finished to a high flatness necessary to accommodate fine patterns of the EUVL or the like. Specifically, they are required to have a flatness of up to 50 nm within a central region of 142 mm squares on the substrate surface. Several versions of substrates have been proposed as meeting the requirement. For example, JP-A 2007-287737 discloses a highly flat and highly smooth substrate obtained by local processing such as by gas cluster ion beam etching and finish polishing. JP-A 2004-291209 discloses a method for producing a highly flat and low defective substrate through local machining by plasma etching and subsequent non-contact polishing. However, the above methods for flattening substrates are inconvenient in the apparatus size and process flow, and the eventual increases in processing cost and time are outstanding problems. For example, the gas cluster ion beam etching requires a time-consuming step of creating a vacuum environment prior to the start of processing, and the non-contact polishing such as float polishing is disadvantageous in that a longer polishing/processing time is needed due to a low polishing rate. A greater capital of investment needed for the large size of apparatus and operation expenses including expensive gases necessary for the processing are reflected by the cost of substrate processing so that substrates may become more expensive. Increases in the price of glass substrates are unfavorable to both the supply and demand sides.

WO 2004083961 describes a substrate in which the maximum height from a reference plane at the boundary between a main surface and a chamfered surface and the shape are specified so that the substrate may be improved in flatness when vacuum chucked. However, the substrate has a flatness of 0.2 at best as described in the patent document. By taking into account a shape change when the substrate is mounted on the stepper by suction chucking, a substrate is designed to have a peripheral portion which is flat or outward inclined. However, with this area setting, flatness control is difficult because a shape change of the peripheral portion has a less influence on flatness within the effective range. Accordingly, the proposal is short of capability for high-flatness substrates such as substrates for the EUVL that imposes a severe requirement on the flatness of substrate surface.

Even if a substrate is prepared to a high flatness sufficient to accommodate not only the ArF excimer laser lithography, but also the EUVL, the flatness is broken upon mounting of the substrate on the stepper by suction chucking. There is a need for a glass substrate having a shape which has taken into account a shape change of the substrate by suction chucking. In order to comply with the EUV lithography, the substrate must meet a flatness of up to 50 nm over the effective range when the substrate is mounted on the stepper by suction chucking.

CITATION LIST

Patent Document 1: JP-A 2007-287737 (WO 2007119860)
Patent Document 2: JP-A 2004-291209 (US 20040192171, DE 10 2004 014953)
Patent Document 3: WO 2004083961

SUMMARY OF INVENTION

An object of the invention is to provide a synthetic quartz glass substrate having a surface with high flatness, low defect density, and minimal surface roughness and suited for use as a photomask, and a method for preparing the same.

The inventors have found that a 6-inch square substrate having a major surface which is divided into three areas wherein the shape of each area is specified is useful in controlling the flatness of the substrate surface when the substrate is mounted on the stepper by suction chucking.

Accordingly, the invention provides a synthetic quartz glass substrate having a major surface of 6 inch squares including a central surface area of 148 mm squares including a central surface area of 132 mm squares, a surface region extending from the perimeter of the central surface area of 132 mm squares to the perimeter of the major surface being inclined, wherein the central surface area of 132 mm squares has a flatness of up to 50 nm, and a frame region of the central surface area of 148 mm squares excluding the central surface area of 132 mm squares has a flatness of up to 150 nm.

In a preferred embodiment, the central surface area of 132 mm squares has an average plane and the frame region has an average plane, and the average plane of the central surface area of 132 mm squares is higher than the average plane of the frame region by 100 nm or less.

In a preferred embodiment, when the glass substrate is mounted on a stepper by suction chucking at a 3-mm region extending from 2 mm to 5 mm inward from the perimeter of the major surface, the substrate presents a flatness of up to 50 nm over a central surface area of 142 mm squares.

In a preferred embodiment, the glass substrate has a surface roughness (RMS) of up to 0.10 nm over the area of 6 inch squares. In a further preferred embodiment, the glass substrate is free of raised defects, recessed defects and streak flaws over the area of 6 inch squares. Often the substrate is made of titania-doped quartz glass. The synthetic quartz glass substrate is typically used to form a photomask.

In another aspect, the invention provides a method for preparing the synthetic quartz glass substrate, comprising the steps of roughly polishing a surface of a synthetic quartz glass substrate, measuring the flatness of the polished substrate surface, partially polishing the substrate surface in accordance with the measured flatness, and finish polishing the partially polished substrate surface.

Advantageous Effects of Invention

The synthetic quartz glass substrate of the invention may be used as the photomask in the photolithography for writing finer images since it meets the requirement that the substrate surface have a high flatness, low defect density, and minimal roughness. When the substrate is mounted on the stepper by suction chucking, the flatness within the effective range of the substrate surface meets the specifications required by the EUVL process.

DESCRIPTION OF EMBODIMENTS

As used herein, the term "area of 132 mm squares," for example, refers to a square area of 132 mm×132 mm. All square areas are defined as having a common center with the square major surface of the substrate.

The synthetic quartz glass substrate of the invention is used as the photomask for the fabrication of semiconductor devices by the lithography utilizing ArF excimer laser light source and the lithography utilizing EUV light for writing finer images. As to the size, 6-inch square substrates as used in conventional photomasks are desirable. Specifically, square shaped 6025 substrates of 152 mm×152 mm×6.35 mm thick are adequate.

Figure 1:
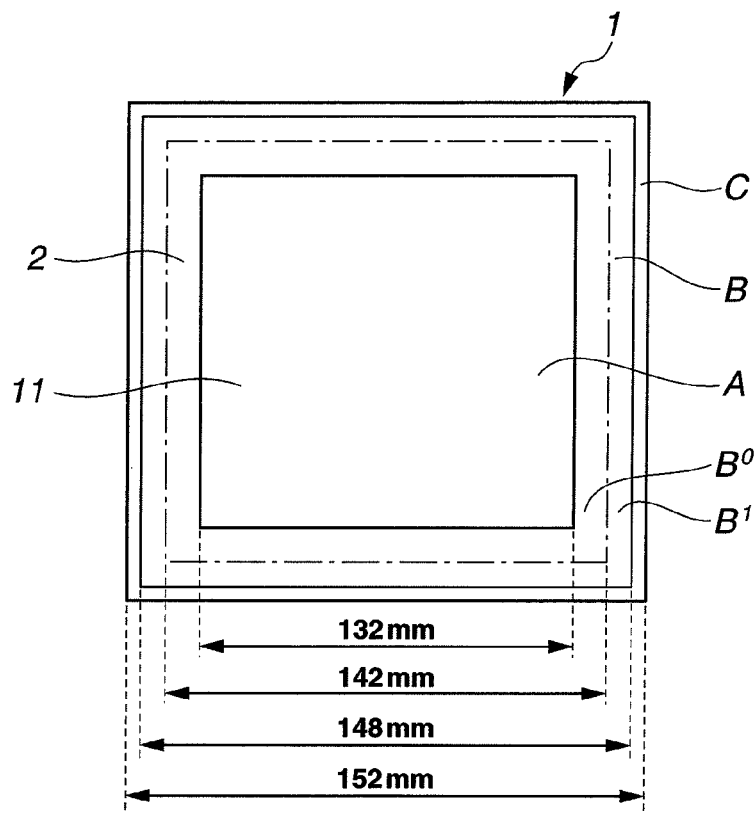
FIG. 1 is a plan view of a synthetic quartz glass substrate according to the invention, showing three areas of the substrate surface.
Figure 2:
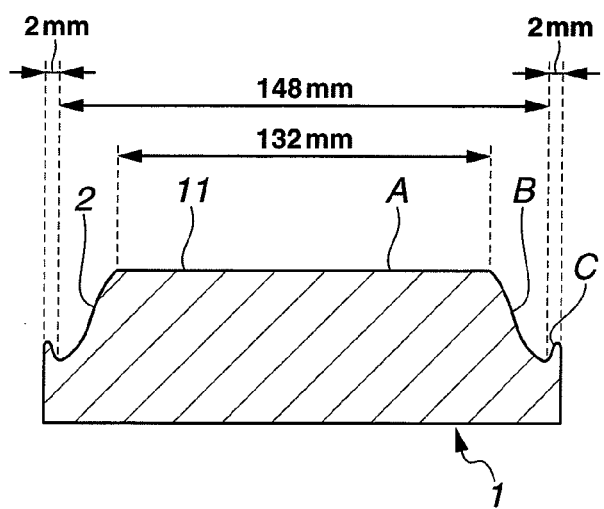
FIG. 2 is an exaggerated cross-sectional view of the synthetic quartz glass substrate.

Referring to FIGS. 1 and 2, there is illustrated a synthetic quartz glass substrate 1 of 6 inch (152 mm) squares having a major or front surface (upper surface in FIG. 2) which may be divided into three areas A, B, and C, more specifically into four areas A, $B^0$, $B^1$, and C. Area A is a central surface area of 132 mm squares. Area B, which is also referred to as "frame region," is an area defined between the perimeter of the central surface area A of 132 mm squares and the perimeter of a central surface area of 148 mm squares and is inclined from the perimeter of area A toward area C. Area C, which is also referred to as "outermost region," is an area defined between the perimeter of the central surface area of 148 mm squares and the perimeter of the major surface of the substrate. The perimeter or outer edge of area C may be chamfered. Area B may be further divided into two, area $B^0$ defined between the perimeter of the central surface area A of 132 mm squares and the perimeter of a central surface area of 142 mm squares, and area $B^1$ defined between the perimeter of the central surface area of 142 mm squares and the perimeter of the central surface area of 148 mm squares.

Figure 3:
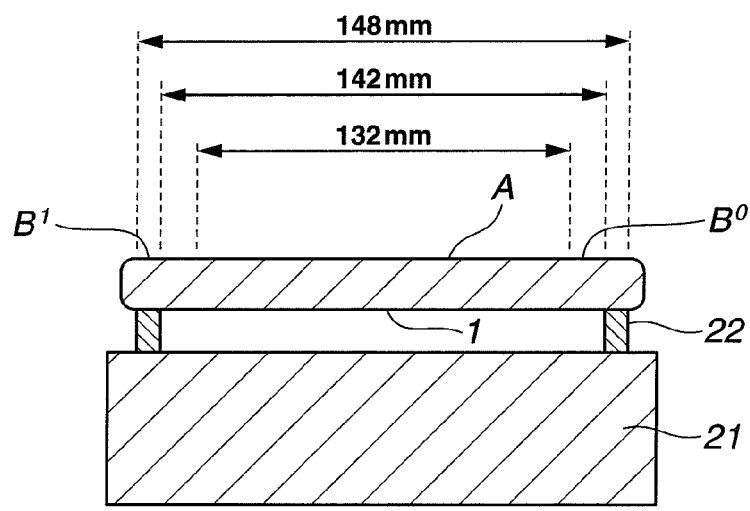
FIG. 3 schematically illustrates a synthetic quartz glass substrate mounted on a stepper by suction chucking.

The area $B^1$ which extends from 2 mm to 5 mm inward from the perimeter of the major surface is subject to suction chucking when the substrate is mounted on a stepper stage as shown in FIG. 3. With the substrate so mounted, areas A+$B^0$ provide for an effective area in performing a lithography process.

According to the invention, the central surface area A of 132 mm squares has a flatness of up to 50 nm, preferably up to 40 nm, and more preferably up to 30 nm. This area A is required to have a high flatness prior to suction chucking because this area experiences only a minimal deformation by a chucking force when the substrate is mounted on the stepper by suction chucking. This flatness is the least flatness required for fine image writing by the EUVL or similar lithography. The lower limit of the flatness, which is not critical, may be 0 nm, but is typically at least 5 nm.

The flatness of a substrate surface represents a warpage of a substrate surface. Provided that an arbitrary plane computed from a substrate major surface by the method of least squares is a focal plane, the flatness is computed from the absolute value of the altitude difference between the highest position of the substrate surface above the focal plane and the lowest position of the substrate surface below the focal plane.

From the standpoint of measurement accuracy, the method for measuring a flatness of a surface is desirably of the optical interference mode based on the principle that when coherent light, typically laser light is directed to a substrate surface and reflected thereby, a difference in height of the substrate surface is observed as a phase shift of the reflected light. For example, the flatness may be measured by an optical analyzing system UltraFlat® M200 (Corning Tropel Corp.).

Figure 4:
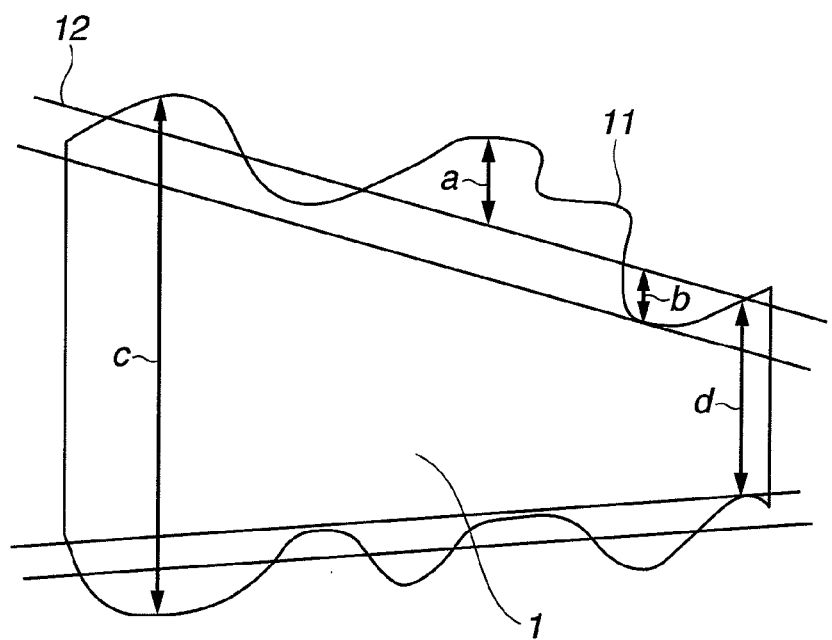
FIG. 4 is a schematic cross-sectional view of a glass substrate, illustrating flatness and parallelism.

FIG. 4 is a schematic cross-sectional view of a substrate 1 for illustrating flatness and parallelism. Provided that a least squares plane 12 computed from a substrate surface 11 is used as a reference plane, the flatness is the sum of a maximum (absolute value) "a" of the distance between a raised portion of the substrate surface 11 and the reference plane 12 and a minimum (absolute value) "b" of the distance between a recessed portion of the substrate surface 11 and the reference plane 12. The parallelism is the difference between a maximum "c" and a minimum "d" of the distance between the front and back surfaces.

A substrate having a high flatness is worthless as such unless it maintains the high flatness in the actual image writing environment where the substrate is mounted on the stepper by suction chucking. Then, the flatness of the frame region 2 or area B (obtained by subtracting the central surface area A of 132 mm squares from the central surface area of 148 mm squares) is herein specified so that the substrate may display a high flatness when mounted on the stepper by suction chucking.

By taking into account a change by suction chucking, the frame region 2 or area B is specified to a flatness of up to 150 nm, preferably up to 120 nm, so that the central area of the substrate may maintain or improve the flatness. The lower limit of the flatness of the frame region 2 is generally at least 30 nm, and typically at least 50 nm.

As shown in FIG. 3, the substrate 1 is mounted on a stepper stage 21 by suction chucks 22 in contact with area $B^1$ of the frame region 2 or area B. In order that the substrate surface be highly flat after suction chucking, a peripheral region extending from the perimeter of the central surface area A of 132 mm squares to the perimeter of the major surface must be inclined. However, the outermost region (or area C) has no impact on the substrate surface central area even when that region is affected by the suction chucking. Then the outermost region may be of any shape.

The degree of inclination is preferably determined such that a least squares plane of central surface area A of 132 mm squares is higher than a least squares plane of the frame region 2 (or area B) by a distance of at most 100 nm, more preferably 50 nm to 100 nm, and even more preferably 50 nm to 80 nm.

When an amount of a change that the flatness of the substrate surface experiences when the substrate is mounted on the stepper by suction chucking is considered, it is undesirable that the frame region 2 (or area B) obliquely extending to the perimeter of the major surface is inclined too much. That is, if the frame region 2 (or area B) is positioned much lower than the central surface area A of 132 mm squares, it is difficult for the substrate to present a flatness of up to 50 nm over a central surface area of 142 mm squares (area A+B$^0$) which is the effective range for the EUVL.

In the central surface area A of 132 mm squares, the extent of impact on the flatness of the substrate surface by mounting of the substrate on the stepper by suction chucking is very low as compared with the outer perimeter portion. Accordingly, the central surface area A of 132 mm squares preferably has a flatness of up to 50 nm, more preferably up to 40 nm, and even more preferably up to 30 nm, as mentioned above.

The synthetic quartz glass substrate of the invention is designed so as to comply with the EUV generation of lithography. As is known in the art, the effective range for the EUVL is the central surface area of 142 mm squares (area) A+B$^0$ in the case of 6025 substrate, for example, which has a flatness of up to 50 nm. To meet this condition, the synthetic quartz glass substrate of the invention is designed such that the central surface area of 142 mm squares (area) A+B$^0$ may have a flatness of up to 50 nm when the substrate is mounted on the stepper by suction chucking. However, it is preferred in practice that the central surface area of 142 mm squares have a flatness of up to 40 nm, and more preferred that the central surface area of 142 mm squares have a flatness of up to 30 nm.

The back surface of the substrate is such that it may assume a plane as closely as possible when the substrate is mounted on the stepper. The back surface has such a flatness that it may give no impact to the front surface in implementing the lithography. Specifically, the back surface is designed such that a central surface area of 142 mm squares may have a flatness of up to 500 nm upon suction chucking. In implementing the EUVL, however, the back surface is designed like the front surface such that a central surface area of 142 mm squares may have a flatness of up to 50 nm upon stepper mounting.

The synthetic quartz glass substrate of the invention preferably has a parallelism of up to 5 μm, more preferably up to 4 μm, and even more preferably up to 3 μm, for the purpose of minimizing the deflection of the substrate upon stepper mounting.

The synthetic quartz glass substrate preferably has a surface roughness (in RMS) of up to 0.10 nm, and more preferably up to 0.08 nm. If the lithography is implemented using a substrate having a high surface roughness (RMS), that surface roughness has an impact on the size and accuracy of fine image writing. To comply with the EUVL, the substrate must have a lower surface roughness than that required by the ArF or KrF lithography. The lower limit of surface roughness (RMS) is usually at least 0.05 nm though not critical.

Preferably the synthetic quartz glass substrate in an area of 6 inch squares is free of raised defects having a length of several tens of nanometers to about 500 nm and a height of several nanometers to several tens of nanometers, recessed defects having a length of several tens of nanometers to about 500 nm and a depth of several nanometers to about 100 nm, and thin streak flaws having a depth of 1 to 5 nm and a length of 1 micron to several tens of microns. If such defects are present on the substrate surface, the defects are transferred together when an image is written by the lithography, interfering with fine image writing. Such defects may be removed by the polishing step to be described later.

When the substrate is used in the EUVL, the material of the substrate is specified as well as the flatness, defect density and roughness of the substrate surface. The substrate is preferably made of quartz glass doped with TiO$_2$ in a concentration of 5 to 12% by weight for the purpose of reducing a coefficient of thermal expansion.

The glass substrate may be used as the semiconductor-related electronic material and advantageously in forming photomasks.

The glass substrate may be prepared by a method comprising the steps of roughly polishing a synthetic quartz glass substrate, measuring the flatness of the polished substrate, partially polishing the substrate in accordance with the flatness measurements, and finish polishing the partially polished substrate.

After the steps of shaping a synthetic quartz glass ingot, annealing, slicing, chamfering, and lapping, the glass substrate is mirror finished by rough polishing of the substrate surface.

The glass substrate is then measured for flatness. Usually, the substrate which has been roughly polished to be ready for configuring the desired substrate shape has a flatness of 0.3 to 1.0 μm on its surface. The synthetic quartz glass substrate is configured into the desired shape by a partial polishing technique using a small-size rotary machining tool. A removal amount (to be polished away) at each site on the substrate surface is determined on the basis of the topographic measurement data of the substrate surface, and partial polishing is carried out toward the preset target shape. The removal amount may be controlled by the travel speed of the tool. Specifically when a larger removal amount is desired, the travel speed of the tool across the substrate surface is slowed. Since the removal amount becomes smaller as approaching to the target shape, the travel speed of the tool across the substrate surface is accelerated. In this way, the removal amount of material to be polished away is controlled.

A machining section for partial polishing may be a rotary grinding tool like Leutor tool. From the standpoint of mitigating the damage to glass by polishing, the material of the rotary grinding tool in contact with the glass may be selected from polyurethane, felt buff, rubber and cerium pads having a scale A hardness of 50 to 75 (JIS K6253) although the type of material is not limited thereto as long as glass surface can be ground. The shape of the machining section of the rotary tool may be a circle, doughnut, cylinder, cannonball, disk or barrel shape.

After the partial polishing, the substrate surface preferably has a flatness of 0.01 to 0.50 μm, more preferably 0.01 to 0.30 μm. The substrate may have a convex, concave or other profile (or topography) depending on the final finish-polishing conditions and the desired specifications.

Following the partial polishing, the substrate is subjected to finish polishing. Batchwise polishing by a conventional single-wafer type polisher is performed to eliminate or ameliorate the defects and surface roughness which have been introduced until the partial polishing step. The polishing cloth is preferably of suede. A relatively low polishing rate is preferably selected to enable moderate polishing so that the shape configured by the partial polishing may not make a rapid transition to the final target shape. For the finish polishing, a colloidal silica water dispersion having a particle size of 30 to 150 nm, more preferably 30 to 100 nm may be used as the abrasive slurry.

For the thus obtained synthetic quartz glass substrate, the shape after finish polishing may be determined depending on the shape configured by partial polishing. That is, the surface shape or topography of the final substrate may be controlled depending on the shape configured by partial polishing.

A removal amount by finish polishing is preferably 4 to 8 µm in the case of single-wafer type polishing. The removal amount is so determined for effectively eliminating work damages introduced during the partial polishing step where the tool is in direct contact with the surface of the quartz glass substrate.

The substrate resulting from the finish polishing is measured for surface flatness. Based on the measurement data, the chucking force for mounting the substrate on the stepper is controlled, thereby controlling the flatness of the substrate upon stepper mounting.

EXAMPLE

Examples of the invention are given below by way of illustration and not by way of limitation.

Example 1

A synthetic quartz glass ingot was sliced into a glass substrate stock of 6 inches square, which was lapped by a double-side lapping machine of planetary motion and then roughly polished by a double-side polishing machine of planetary motion, yielding a starting substrate. The starting substrate had a flatness of 0.398 µm in an area of 6 inches square. Note that the flatness was measured by UltraFlat® M200 (Corning Tropel Corp.).

Thereafter, the substrate was set in a partial polishing machine equipped with a felt buff tool of cannonball shape having a diameter of 20 mm and a length of 25 mm as the polishing section (F3620 by Nihon Seimitsu Kikai Kosaku Co., Ltd.). The machining tool was operated under conditions: a rotational speed of 5,000 rpm and a machining pressure of 160 g/mm², and traversed over the workpiece to polish the entire substrate surface. The abrasive slurry used was a colloidal silica water dispersion. The processing procedure included continuously moving the machining tool parallel to X axis of the substrate, and moving the tool at a pitch of 0.25 mm in the Y axis direction. Under these conditions, an optimum processing rate of 1.9 µm/min was set based on the previous measurement. The moving speed of the machining tool was set to 50 mm/sec at the lowest substrate portion in the substrate shape. The processing time was 98 minutes. The substrate shape after partial polishing was set by previously taking into account the amount of removal of the substrate by the final finish-polishing. The substrate after partial polishing had a flatness of 0.286 µm over the entire substrate surface. It is noted that the substrate was configured in point symmetry so that the force of final polishing might be evenly applied to the substrate.

Next, using a soft suede polishing cloth and an aqueous colloidal silica dispersion having a SiO, concentration of 40 wt % as the abrasive slurry, final precision polishing was carried out on the glass substrate under a polishing load of 100 gf. The removal amount was 4 µm, which was sufficient to remove the scratches or flaws generated during the rough polishing and partial polishing steps.

The polishing step was followed by washing and drying. The glass substrate was measured for surface flatness, finding a flatness of 37 nm in the central surface area of 132 mm squares and a flatness of 121 nm in the frame area. By atomic force microscopy (AFM), the surface roughness (RMS) of the substrate was measured to be 0.07 nm. The substrate was inspected for defects by a laser confocal optics high-sensitivity defect inspection system (Lasertec Corp.), detecting no raised defects, recessed defects and streak flaws.

When the substrate was mounted on a stepper by suction chucking at area $B^1$ along the sides of its central surface area of 148 mm squares, the central surface area of 142 mm squares showed a flatness of 47 nm.

Example 2

The procedure of Example 1 was generally followed. A synthetic quartz glass ingot doped with 7.0 wt % of $TiO_2$ was sliced into a glass substrate stock of 6 inches square, which was roughly polished, yielding a starting substrate. The starting substrate had a flatness of 0.371 µm in an area of 6 inches square.

The processing conditions for subsequent partial polishing included a machining tool rotational speed of 6,000 rpm and a machining pressure of 160 g/mm², the machining tool was traversed over the workpiece to polish the entire substrate surface. The abrasive slurry used was a colloidal silica water dispersion. The processing procedure included continuously moving the machining tool parallel to X axis of the substrate, and moving the tool at a pitch of 0.25 mm in the Y axis direction. Under these conditions, an optimum processing rate of 1.1 µm/min was set based on the previous measurement. The moving speed of the machining tool was set to 50 mm/sec at the lowest substrate portion in the substrate shape. The processing time was 102 minutes. The substrate after partial polishing had a flatness of 0.277 µm over the entire substrate surface. It is noted that the substrate was configured in point symmetry so that the force of final polishing might be evenly applied to the substrate. Next, final precision polishing was carried out on the glass substrate as in Example 1. The removal amount was 5 µm, which was sufficient to remove the scratches or flaws generated during the rough polishing and partial polishing steps.

The polishing step was followed by washing and drying. The glass substrate was measured for surface flatness, finding a flatness of 41 nm in the central surface area of 132 mm squares and a flatness of 108 nm in the frame area. By AFM, the surface roughness (RMS) of the substrate was measured to be 0.07 nm. The substrate was inspected for defects by a laser confocal optics high-sensitivity defect inspection system (Lasertec Corp.), detecting no raised defects, recessed defects and streak flaws.

When the substrate was mounted on a stepper by suction chucking at area $B^1$, the central surface area of 142 mm squares showed a flatness of 48 nm.

Example 3

The procedure of Example 1 was generally followed. A synthetic quartz glass ingot was sliced into a glass substrate stock of 6 inches square, which was roughly polished, yielding a starting substrate. The starting substrate had a flatness of 0.303 µm in an area of 6 inches square.

The processing conditions for subsequent partial polishing included a machining tool rotational speed of 3,000 rpm and a machining pressure of 160 g/mm², the machining tool was traversed over the workpiece to polish the entire substrate surface. The abrasive slurry used was a colloidal silica water dispersion. The processing procedure included continuously moving the machining tool parallel to X axis of the substrate, and moving the tool at a pitch of 0.25 mm in the Y axis direction. Under these conditions, an optimum processing rate of 1.9 μm/min was set based on the previous measurement. The moving speed of the machining tool was set to 50 mm/sec at the lowest substrate portion in the substrate shape. The processing time was 102 minutes. The substrate after partial polishing had a flatness of 0.222 μm over the entire substrate surface. It is noted that the substrate was configured in point symmetry so that the force of final polishing might be evenly applied to the substrate.

Next, final precision polishing was carried out on the glass substrate as in Example 1. The removal amount was 4.2 μm, which was sufficient to remove the scratches or flaws generated during the rough polishing and partial polishing steps. The removal amount by polishing was set for further precision polishing, by analyzing how the substrate was machined based on the previous polishing data, determining an optimum removal amount of polishing by the method of least squares, and controlling to the number of one place below the decimal point.

The polishing step was followed by washing and drying. The glass substrate was measured for surface flatness, finding a flatness of 21 nm in the central surface area of 132 mm squares and a flatness of 98 nm in the frame area. By AFM, the surface roughness (RMS) of the substrate was measured to be 0.07 nm. The substrate was inspected for defects by a laser confocal optics high-sensitivity defect inspection system (Lasertec Corp.), detecting no raised defects, recessed defects and streak flaws.

When the substrate was mounted on a stepper by suction chucking at area $B^1$, the central surface area of 142 mm squares showed a flatness of 27 nm.

Japanese Patent Application No. 2010-118319 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A synthetic quartz glass substrate having a front surface having a 6 inch square major surface including a central surface area of 148 mm square including a central surface area (A) of 132 mm square, a surface region extending from the perimeter of the central surface area (A) of 132 mm square to the perimeter of the major surface being inclined and a back surface, wherein
   on the front surface, the central surface area (A) of 132 mm square has a flatness of up to 50 nm,
   on the front surface, a frame region (B), constituted by the central surface area of 148 mm square excluding the central surface area (A) of 132 mm square, has a flatness of up to 150 nm,
   the central surface area (A) of 132 mm square has an average plane and the frame region (B) has an average plane, and the average plane of the central surface area (A) of 132 mm square is higher than the average plane of the frame region (B) by 50 nm to 100 nm, and
   the front surface and the back surface of the substrate are designed such that a central surface area of 142 mm square of the front surface presents a flatness of up to 50 nm and a central surface area of 142 mm square of the back surface has a flatness of up to 500 nm, when the glass substrate is mounted on a stepper by suction chucking at a 3-mm region extending from 2 mm to 5 mm inward from the perimeter of the major surface of the front surface.

2. The synthetic quartz glass substrate of claim 1, having a surface roughness (RMS) of up to 0.10 nm over the area of 6 inch square on the front surface.

3. The synthetic quartz glass substrate of claim 1 which is free of raised defects, recessed defects and streak flaws over the area of 6 inch square of the front surface.

4. The synthetic quartz glass substrate of claim 1 which is doped with $TiO_2$.

5. The synthetic quartz glass substrate of claim 1 which is used to form a photomask.

6. A method for preparing the synthetic quartz glass substrate of claim 1, comprising the steps of:
   roughly polishing a surface of a synthetic quartz glass substrate,
   measuring the flatness of the polished substrate surface,
   partially polishing the substrate surface in accordance with the measured flatness, and
   finish polishing the partially polished substrate surface.

7. The synthetic quartz glass substrate of claim 1, wherein the central surface area (A) of the front surface has a flatness of 5 to 30 nm and the frame region (B) has a flatness of 50 to 120 nm.

8. The synthetic quartz glass substrate of claim 1, wherein the back surface of the substrate is designed such that a central surface area of 142 mm square has a flatness of up to 50 nm upon stepper mounting.

9. The synthetic quartz glass substrate of claim 1, wherein the synthetic quartz glass substrate has a parallelism of up to 5 μm.

10. The synthetic quartz glass substrate of claim 1, wherein on the front surface, the average plane of the central surface area (A) of 132 mm square is higher than the average plane of the frame region (B) by 50 nm to 80 nm.

11. The synthetic quartz glass substrate of claim 1, wherein on the front surface, the central surface area (A) of 132 mm square has the flatness of up to 40 nm.

12. The synthetic quartz glass substrate of claim 1, wherein on the front surface, the central surface area (A) of 132 mm square has the flatness of up to 30 nm.

* * * * *